United States Patent [19]
Uchikawa et al.

[11] Patent Number: 5,372,850
[45] Date of Patent: Dec. 13, 1994

[54] METHOD OF MANUFACTURING AN OXIDE-SYSTEM DIELECTRIC THIN FILM USING CVD METHOD

[75] Inventors: Fusaoki Uchikawa; Shigeru Matsuno; Shin-ichi Kinouchi; Toshihisa Honda; Takeharu Kuroiwa; Hisao Watarai; Takashi Higaki, all of Hyogo, Japan

[73] Assignee: Mitsubishi Denki Kabushiki Kaisha, Tokyo, Japan

[21] Appl. No.: 18,900

[22] Filed: Feb. 17, 1993

[30] Foreign Application Priority Data

Feb. 17, 1992 [JP] Japan .................................. 4-029574
Oct. 28, 1992 [JP] Japan .................................. 4-289780

[51] Int. Cl.$^5$ ............................................. C23C 16/00
[52] U.S. Cl. ............................ 427/255.3; 427/255.2; 427/255.1; 427/248.1; 427/314; 427/79
[58] Field of Search ............... 427/255.3, 255.2, 255.1, 427/248.1, 314, 79

[56] References Cited

U.S. PATENT DOCUMENTS

| | | | |
|---|---|---|---|
| 4,501,602 | 2/1985 | Miller et al. | 427/255 |
| 5,124,180 | 6/1992 | Proscia | 427/255.3 |
| 5,200,388 | 4/1993 | Abe et al. | 505/1 |

OTHER PUBLICATIONS

Feil et al, "Organometallic chemical vapor deposition of strontium titanate thin films", MRS (Boston, Mass.) Nov. 29–Dec. 1, 1989, pp. 375–379.

Zhao et al, "Organometallic chemical vapor deposition of high Tc superconducting films using a volatile, fluorocarbon-based precursor", Appl. Phys. Lett. 53(18) Oct. 1988, pp. 1750–1752.

"Physiochemical Properties of Metalorganic Compounds for MOCVD of Dielectric Substance (I), Pb(DPM)$_2$" 52nd Applied Physics Association Seminar, 1990, preliminary report No. 9a-P-11, Nimura, et al.

"Preparation of Pb(Zr,Ti)O$_3$ Thin Film by MOCVD", The 39th Spring Meeting, 1992, The Japan Society of Applied Physics and Related Societies, Extended Abstracts, No. 30a-ZW-6, Miki, et al.

Primary Examiner—Roy V. King
Attorney, Agent, or Firm—Wolf, Greenfield & Sacks

[57] ABSTRACT

In a process for manufacturing an oxide-system dielectric thin film using a raw material compound in which a metal atom is coupled with an organic group through oxygen atoms by the CVD method. A vapor of organic solvent having a boiling point less than 100° C. contacts to the raw material compound at least in one of processes for vaporizing or transporting said raw material compound. The raw material compound of oxide-system dielectric thin film can be vaporized stably and transported to the reactor at a low temperature than before. Therefore, a composition can be controlled homogeneously and an oxide-system dielectric thin film having a good performance can be manufactured.

33 Claims, 1 Drawing Sheet

METHOD OF MANUFACTURING AN OXIDE-SYSTEM DIELECTRIC THIN FILM USING CVD METHOD

FIELD OF THE INVENTION

This invention relates to a method for manufacturing an oxide-system dielectric thin film using a chemical vapor phase epitaxy (CVD) method which is applied for a dielectric memory.

DESCRIPTION OF THE PRIOR ART

In recent years, integration of semi-conductor memory devices has rapidly advanced. For example, regarding the dynamic random access memory (DRAM), bit number has increased at the sudden pace of, for example, 4 times in 3 years.

This is because of attaining high speed of device, and low consumption power and low cost. But, even if an integration degree is improved, a capacitor which comprises one of the elements in DRAM must have a certain value of capacitance. From this reason, it is necessary to cause the film thickness of capacitor material to be thin. Therefore, the thickness of the thin film using $SiO_2$ which has been used so far is limited for thinner film. If dielectric constant increases by changing material, it is able to obtain thinner film as well as a certain amount of capacity.

Accordingly, studies for the dielectric material which has large dielectric constant and is used for memory device become the object of public attention these days.

Regarding the performance required for capacitor material, it has been most important that the material is a thin film which has large dielectric constant and has small leak current. That is, it is necessary to use large dielectric constant material and also a thinner film and to make the leak current be minimum. For a general development aim, it is desirable that the $SiO_2$ equivalent thickness of the thin film is less than 1 nm and the leak current density is less than the order of $10^{-8}$ A/cm$^2$ when 1.65 V is applied to the thin film. For forming a thin film on the capacitor electrode of the DRAM having stage difference, it is profitable for the process to cause the thin film to stick well around the complex shape of the body using the CVD method. From the above points of view, oxide-system dielectric thin film such as tantalum-oxide, lead-titanium zirconate (PTZ), lead-lanthanum-zirconium titanate (PLZT), strontium titanate and barium titanate are examined for forming a thin film using all kinds of film formation methods. Though it is most advantageous to form a film using the CVD method, it is troublesome that there are no materials as a raw material compound (referred to raw material, below) having good stability and vaporization characteristics for CVD. This is because the heating vaporization characteristics of the dipivaloyl-methane (DPM) compound of $\beta$-diketonate-system is principally not good, which is used a lot as a raw material for CVD. It is pointed out that this is a substantial defect caused by essential instability of metal DPM compound, for example, in the 52$^{nd}$ Applied Physics Association Seminar preliminary report No. 9a-P-11. As shown in the report No. 9a-P-11, the CVD method is still studied in spite of the above defect. It happens at an extreme occasion that the raw material has to be thrown away during the film forming when the raw material is instable. Accordingly, when the raw material mentioned above has the defect, good performance of the dielectric thin film and good manufacturing repeatability are not obtained at present.

As described above, regarding the method for manufacturing an oxide-system dielectric thin film by conventional CVD method, good vaporization and good high temperature stability of the raw material can not be obtained for producing an oxide-system dielectric film. Therefore, it is impossible to heat the raw material at a low temperature and transport it stably to the CVD reactor.

Therefore, it is difficult to control the composition and also there is a big problem that a dielectric thin film can not be formed stably in order to get good characteristics. On the other hand, if the raw material is heated at a high temperature in order to increase the vaporization efficiency, thermal decomposition occurs during transporting the raw material. Therefore, a crystallization failure of the film or composition drift inevitably occurs. In addition, the raw material is thrown away inconveniently as described above. If the reaction time becomes long by suppressing vaporization speed, the vaporization state of the raw material changes as time goes by. Therefore, the film composition becomes heterogeneous toward the thickness direction, and thus the leak current inevitably increases. For this reason, the development is strongly expected to vaporize the material well and stably in the low temperature. But, there is still no further progress with respect to the technique.

The inventors discussed in detail about a vaporization of compound in which a metal atom such as the above mentioned metal-DPM compound couples with organic group through oxidation atoms. As a result, it becomes clear that the vaporization and the high temperature stability of the alkaline earth metals such as Ba and Sr and the compound such as Pb and Ti are not good.

Therefore, in case of manufacturing the oxide-system dielectric film which has the metal oxide as its main ingredient using CVD method, it is found that it become peculiarly difficult to control the target composition. Accordingly, the inventors heated the compound at a lower temperature than before and evaporated it stably without heat decomposition. As a result, the controllability of the composition has been improved and the oxide-system dielectric thin film having predetermined characteristics is obtained with good reproductivity.

SUMMARY OF THE INVENTION

Therefore, the manufacturing method of the present invention is invented to eliminate the above defect which occurs in the method for manufacturing the oxide-system dielectric thin film using the above conventional CVD method. Also, the raw material is vaporized by heating it at a lower temperature than before, and is transported stably to the reactor.

Accordingly, it is an object of the present invention is to manufacture an oxide-system dielectric thin film having a good performance used for forming a capacitor.

A method for manufacturing an oxide-system dielectric thin film using a raw material compound in which a metal atom is coupled with an organic group through oxygen atoms by CVD method, comprises a step of causing a vapor of organic solvent having a boiling point less than 100° C. to contact the raw material compound at least in one of a processes for vaporizing or transporting the raw material compound.

The metal atom of the raw material compound in which the metal atoms is coupled with organic group through oxygen atoms is desirably selected at least among Pb, Ti, Zr, Ta or alkaline earth metals.

The metal atom of raw material compound in which the metal atom is coupled with organic group through oxygen atoms is desirably Sr and/or Ba.

The raw material compound in which the metal atom is coupled with organic group through oxygen atoms is desirably selected among acetyl-acetonates, dipivaloyl-methanates, alkoxides, hexafluoro-acetyl-acetonates, penta-fluoro-propanoyl-pivaloyl-methanates of metals, and those derivatives. For purposes of clarity, two of these species are drawn below.

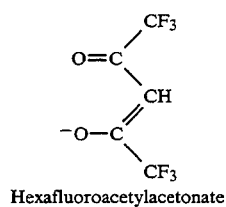

Hexafluoroacetylacetonate

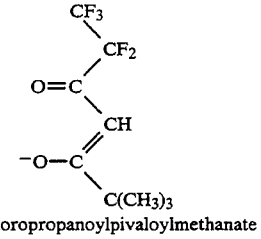

Pentafluoropropanoylpivaloylmethanate

The raw material compound in which the metal atom is coupled with organic group through oxygen atoms is desirably selected among dipivaloyl-methanates, hexafluoro-acetyl-acetonate and penta-fluoro-propanoyl-pivaloyl-methanate of Pb and alkaline earth metals and alkoxides of Ti and Zr.

The raw material compound in which the metal atom is coupled with organic group through oxygen atoms is desirably dipivaloyl-methanate of Sr and/or Ba.

The organic solvent having a boiling point less than 100° C. is desirably selected among hydrocarbons, alcohols, ethers, ketones and amines.

The organic solvent having a boiling point less than 100° C. is desirably selected among diethylether, dimethyl-ketone and tetra-hydro-furan.

DETAILED DESCRIPTION OF THE PREFERRED EMBODIMENT

Embodiment 1

Figure 1:
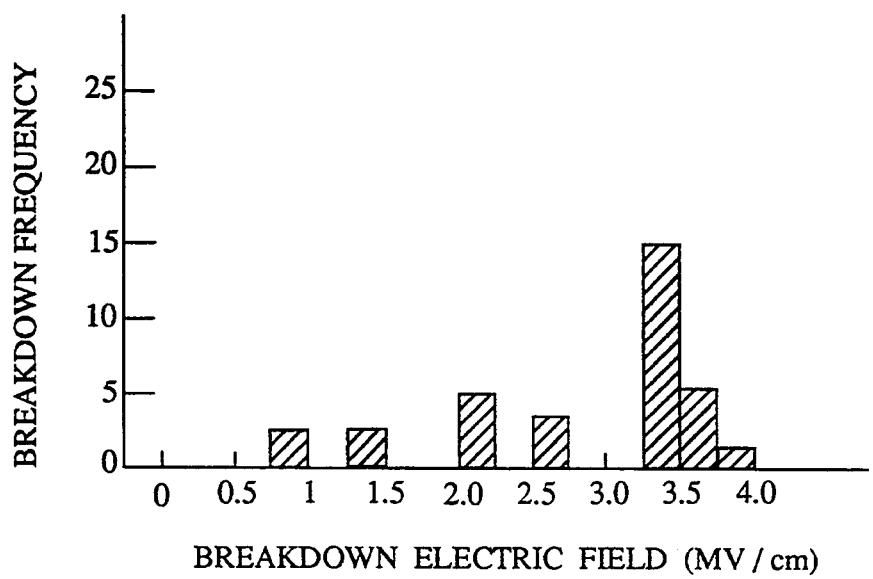
Figs. 1(a) and 1(b) show frequency distribution of breakdown voltage of a barium-strontium titanate system dielectric thin film obtained by the method of the present invention and the conventional method.
Figure 1:
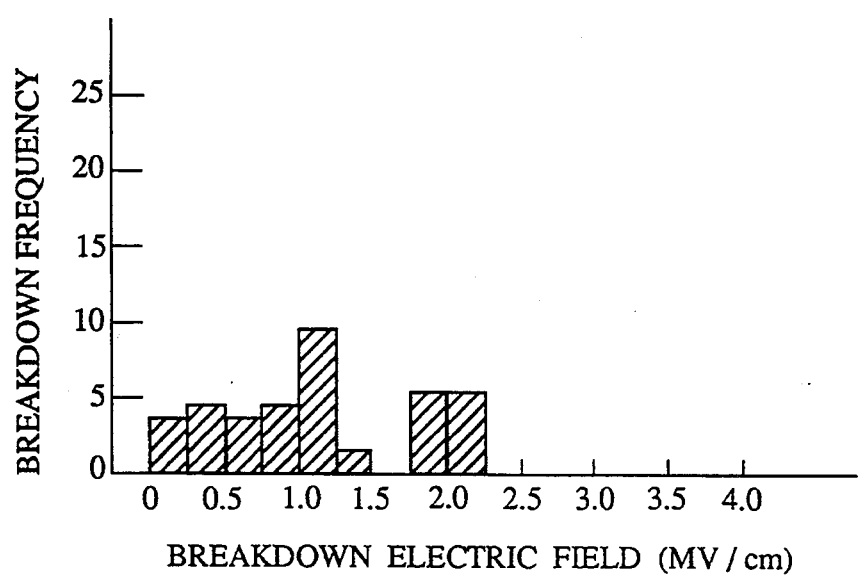

An experiment was carried out using the CVD equipment of the ordinary hot wall type having a three source system for heating the raw material, in order to manufacture a dielectric thin film comprised of strontium titanate oxide ($SrTiO_3$) on the magnesium-oxide substrate using the method of the invention. The raw material is acetyl-acetonate derivative comprised of Sr and Ti, that is, strontium acetylacetonato and titanium acetylacetonato, drawn below.

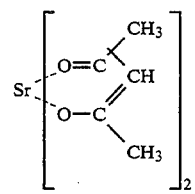

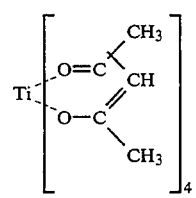

Vapor of dimethyl-ketone (boiling point is 57° C.), which is organic solvent, is flowing through on the raw material and contacts it during the heating time. As reaction conditions in the Sr compound, heating temperature of the raw material is set to 190° C., carrier gas is set to argon (although nitrogen, helium or neon could be used as carrier gasses in this and other embodiments), reaction gas is set to oxygen (although $O_3$ or $N_2O$ could be used as reaction gasses in this and other embodiments), internal pressure of reactor (furnace) is set to 8 Torr, substrate temperature is set to 700° C. and reaction time is set to 10 minutes.

After the reaction has finished, the substrate temperature is cooled spontaneously until the room temperature in the oxygen flow, then an oxide dielectric thin film having the thickness of approximately 60 nm is obtained. The crystallization is examined using X-ray diffraction, then the dielectric constant and the leak current density are measured by applying DC voltage of 1.65 V to the film. The result is shown in table 1.

Comparison Example 1

A method for manufacturing an oxide dielectric thin film is carried out, using the similar raw material under the same reaction conditions as that of the embodiment 1, using the conventional CVD method which does not mix an organic solvent. In case of Ti, deposition was found on the substrate, but in case of Sr, the deposition is not found on the substrate and there is little vaporization at the heating temperature of 185° C.

In the comparison example 1, the temperature for heating the raw materials is set to 230° C. for Sr compound, and 250° C. for Ti compound and then 30 minutes reaction is held. After the reaction is finished, the substrate is cooled spontaneously until room temperature in the oxygen flow in the same manner as that of the embodiment 1 in order to obtain a film having thickness of 200 nm. The performance of the obtained film is also measured in the same way. The result is shown in table 1.

TABLE 1

| | Crystal axis orientation | $SiO_2$ equivalent film thickness (nm) | Dielectric Constant | Leak current density ($A/cm^2$) |
|---|---|---|---|---|
| Embodiment 1 | axis a | 0.99 | 230 | $1.6 \times 10^{-8}$ |
| Comparison | axis a | 3.62 | 210 | $8.8 \times 10^{-7}$ |

TABLE 1-continued

Example I

As being apparent from table 1, according to the method of the embodiment 1, a dielectric thin film having good performance can be obtained by setting the heating temperature to a lower value than that in the conventional manufacturing method. Comparing the film of the embodiment 1 with the film manufactured by the conventional method, the film thickness becomes less than ⅓ and the leak current becomes less than 1/50.

In the embodiment 1 and the comparing example 1, the experiment is repeated for 10 times in order to examine the repeatability in the same condition described above. The result shows that there is little dispersion in the relative dielectric constant and the leak current density in the thin film manufactured by the method of the embodiment 1, and also it becomes clear that the method of the invention has good repeatability. On the contrary, the dispersion of both dielectric constant and the leak current density for the film manufactured by the conventional method is more than ±20% against the value of table 1.

Embodiment 2

In the embodiment 2, the same CVD equipment is used and a lead-titanium zirconate system oxide dielectric thin film is manufactured using dipivaloyl-methanate dielectric of Pb, Zr and Ti as raw material, that is, lead dipivaloylmethanato, zirconium dipivaloylmethanato, and titanium dipivaloylmethanato (drawn below).

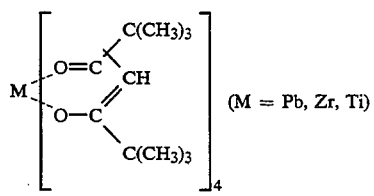

(M = Pb, Zr, Ti)

Each raw material is heated up to 200° C., 190° C. and 180° C., respectively, and the vapor of diethylether (boiling point is 35° C.) as an organic solvent flows together with argon carrier gas so that they contact the raw material. The magnesium-oxide is used as a substrate and the substrate temperature is set to 630° C. The PZT system-oxide-system dielectric thin film is manufactured under the same conditions as that of the embodiment 1, except for the above conditions. The thickness of the obtained film is 127 nm. The obtained performance is also shown in table 2.

Comparison Example 2

A dielectric thin film is manufactured in the same way as described in the embodiment 2, but without mixing the organic solvent, for the same reason as the comparison example 1. That is, in the second comparison example, the same apparatus, raw material and process are used as described in the second embodiment, but the organic solvent is not used like the second embodiment of the present invention and the raw material are heated up to high temperature like the comparison example 1. The heating temperatures for each raw material are maintained to 250° C., 220° C., 230° C., respectively, which are higher than those of the embodiment 2. The thickness of the obtained film is 381 nm. An obtained performance is shown in table 2.

TABLE 2

| | Crystal axis orientation | $SiO_2$ equivalent film thickness (nm) | Dielectric Constant | Leak current density ($A/cm^2$) |
|---|---|---|---|---|
| Embodiment 2 | axis c | 0.57 | 850 | $2.4 \times 10^{-1}$ |
| Comparison Example 2 | axis c | 1.88 | 770 | $9.3 \times 10^{-7}$ |

It is clearly understood from table 2 as well as the embodiment 1 that the film is thinner than that manufactured by the conventional method in spite of low temperature heating than in the conventional manufacturing method. And also an oxide-system dielectric thin film having large relative dielectric constant and small leak current density is obtained. For the embodiment 2 and the comparing example 2, the experiment is repeated for 10 times for examining the repeatability in the same condition described in the embodiment 1. The result shows that the film manufactured by the method of the present embodiment 2 has less dispersion for the relative dielectric constant and the leak current density in comparison with the thin film manufactured by the conventional method and also has good repeatability.

Embodiment 3

In the embodiment 3, the same CVD equipment as that of the embodiment 1 is used. In the embodiment 3, a dipivaloyl-methanate dielectric of Sr, Ba and Ti isopropoxide, that is, strontium dipivaloylmethanato, barium dipivaloylmethanato, and titanium isopropoxide (drawn below), are used as raw material for manufacturing a barium-strontium titanate system dielectric thin film.

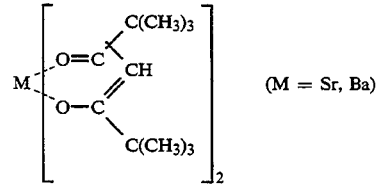

(M = Sr, Ba)

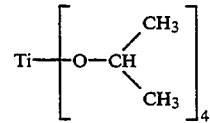

At the time, Sr, Ba, and Ti raw material are heated up to 200° C., 230° C. and 210° C., respectively, and the vapor of tetra-hydro-furan (boiling point is 62° C.) which is an organic solvent flows together with an argon carrier gas and contact the raw material. Since Ti iso-propoxide is liquid, it is heated up to 180° C. in order to vaporize. The magnesium-oxide is used as a substrate and the substrate temperature is set to 635° C. Other conditions are the same as those in the embodiment 1. In the embodiment 3, an oxide dielectric thin film having film thickness of 80 nm is obtained. The performance of the obtained oxide dielectric thin film is shown in table 3.

Comparison Example 3

A dielectric thin film is manufactured in the same way as described in the embodiment 3, but without mixing the organic solvent, for the same reason as the comparison example 1. The heating temperature of Sr and Ti raw material is maintained to 240° C., 260° C., respectively, which are higher than those of the embodiment 3. The obtained film thickness is 150 mn. The performance of the obtained thin film is shown in table 3.

TABLE 3

| | Crystal axis orientation | SiO$_2$ equivalent film thickness (nm) | Dielectric Constant | Leak current density (A/cm$^2$) |
|---|---|---|---|---|
| Embodiment 3 | axis c | 0.71 | 430 | 2.1 × 10$^{-8}$ |
| Comparison Example 3 | axis c | 1.52 | 375 | 9.0 × 10$^{-7}$ |

It is clearly understood from table 3 as well as the embodiment 1 and 2 that the film is thinner than that manufactured by the conventional method in spite of low temperature heating than in the conventional manufacturing method. And also an oxide-system dielectric thin film having large relative dielectric constant and small leak current density is obtained. For the embodiment 3 and the comparing example 3, the experiment is repeated for 10 times in order to examine the repeatability in the same condition described in the embodiment 1. The result shows that the film manufactured by the method of the present embodiment 3 has less dispersion for the dielectric constant and the leak current density in comparison with the thin film manufactured by the conventional method and also has good repeatability.

Embodiment 4

The breakdown voltage was measured in order to inspect an application to a capacitor isolation film used for a silicon integrated semiconductor. A silicon oxide film is formed on the Si substrate having a thickness of 100 nm and a platinum film having a thickness of 100 nm is also formed on the silicon oxide film as a bottom electrode. A barium-strontium titanate system dielectric thin film having the film thickness of 80 nm is manufactured on the bottom electrode in the same way as described in the embodiment 1.

Comparison Example 4

For comparing with the embodiment 4, a thin film of comparison example 4 is manufactured using the conventional method as well as the comparison example 3 without adding the organic solvent. In the comparison example 4, the film thickness is selected to be 80 nm, for easy comparison. A platinum electrode having a diameter of 1.0 mm is formed on the obtained oxide-system dielectric thin film and the breakdown voltage is measured.

FIG. 1(a) shows frequency distribution of breakdown voltage for a barium-strontium titanate system dielectric thin film obtained on the Si substrate by an embodiment 4 of the method of the present invention. FIG. 1(b) shows frequency distribution of breakdown voltage for the same thin film obtained on the Si substrate manufactured by the conventional method.

As easily understood from FIG. 1(a) and FIG. 1(b), the thin film obtained by the method of the present invention has less break down at the low voltage because the high breakdown voltage becomes higher in comparison with the thin film obtained by the conventional method.

In the above embodiment 1–3, in the vaporization process of raw material, during heating the raw material, only the vapor of organic solvent having a boiling point of less than 100° C. or the vapor of organic solvent with the carrier gas contacts the raw material. But, the above process may be effective in the following processes, such as, (i) the vapor of the above organic solvent contacts the material while both of raw material and the solvent are in the vapor phase; or (ii) the organic solvent vapor contacts the raw material while the raw material is in the solid phase and is not yet vaporized. Since the above vaporized raw material in combination with organic solvent is stable at high temperature and does not decompose, an oxide-system dielectric thin film having good performance can be obtained as same as that described in the above embodiment 1–3.

In the present invention, the above compound in which a metal atom is coupled with organic group through oxygen, contacts the organic solvent having a boiling point less than 100° C. A detailed action of the above organic solvent is not well studied at present.

It is assumed that the vapor of above organic solvent acts on the above compound and forms an addition product having a low boiling point, and the addition product has a good vaporization at low temperature heating, and the addition product raises stability of vaporization and transfers itself to the reactor.

In the oxide-system dielectric thin film obtained by the conventional method as described in the comparison examples 1, 2, 3 and the embodiment 4, each crystal has orientation as a result of measurement by X-ray diffraction, but it does not have good characteristics. The above reason can not be clearly explained. It is assumed that heterogeneity occurs in the composition of the thin film on the substrate, because the above raw material compound is hardly vaporized by heat, and also various kinds of reaction occur such as resolution of raw material compound while the compound is vaporized or transported at a high temperature.

According to the method of the invention, the thin film of dielectric material such as PLZT, barium-titanate, tantalum-oxide and lead-titanate is manufactured. In any case, a dielectric thin film having a good performance is obtained with a good repeatability in comparison with the conventional method.

Many kinds of organic solvents are examined for the methods of the present invention. But, organic solvent having the boiling point more than 100° C., such as n-butanol, cyclohexane, dibutylamine and n-octane has no stable effect at a high temperature which is obtained in the present embodiments, even if it contacts the raw material compound. The above performance of the thin film is the same as that of the conventional method which uses no solvent.

In the present invention, there is no special limitation as organic solvent which contacts the raw material compound if the boiling point is less than 100° C. Nevertheless, it is preferable as the organic solvent to use aliphatic-series-system solvent: such as alcohols such as methanol, ethanol or isopropanol; chain and cyclic ethers such as dimethylether, diethylether, methyl-ethyl-ether, dioxane or tetra-hydro-furan; ketones such as dimethyl-ketone or methyl-ethyl-ketone; amines such as dimethylamine or diethylamine, carbonization.

If a metal atom is a compound which is coupled together with organic group through oxygen atoms, the raw material used in the invention has an effect of organic solvent described above. It is desirable to use Pb, Ti, Zr, Ta and alkaline earth metals as a metal. It is also desirable to use acetyl-acetonates, dipivaloyl-methanates, alkoxides, hexafluoro-acetyl-acetonates, penta-fluoro-propanoyl-pivaloyl-methanates and their derivatives.

Those skilled in the art will recognize that many modifications to the foregoing description can be made without departing from the spirit of the invention. The foregoing description is intended to be exemplary and in no way limiting. The scope of the invention is defined in the appended claims and equivalents thereto.

What is claimed is:

1. A method for manufacturing an oxide-system dielectric thin film by the chemical vapor deposition method using a raw material compound in which a metal atom is coupled with an organic group through oxygen atoms, comprising a step of:
    causing a vapor of an organic solvent having a boiling point less than 100° C. to contact the raw material compound in the presence of an inert gas at least in one of a process for vaporizing or transporting said raw material compound, wherein said raw materials is in a form suitable for use in a chemical vapor deposition process.

2. A method for manufacturing an oxide-system dielectric thin film according to claim 1, wherein the metal atom is selected at least from the group consisting of Pb, Ti, Zr, Ta or alkaline earth metals.

3. A method for manufacturing an oxide-system dielectric thin film according to claim 2, wherein the metal atom is Sr.

4. A method for manufacturing an oxide-system dielectric thin film according to claim 2, wherein the metal atom is Ba.

5. A method for manufacturing an oxide-system dielectric thin film according to claim 1, wherein the raw material compound is selected from the group consisting of acetyl-acetonates, dipivaloyl-methanates, alkoxides, hexafluoro-acetyl-acetonates, penta-fluoro-propanoyl-pivaloyl-methanates of metals, and those derivatives.

6. A method for manufacturing an oxide-system dielectric thin film according to claim 2, wherein the raw material compound is selected from the group consisting of acetyl-acetonates, dipivaloyl-methanates, alkoxides, hexafluoro-acetyl-acetonates, penta-fluoro-propanoyl-pivaloyl-methanates of metals, and those derivatives.

7. A method for manufacturing an oxide-system dielectric thin film according to claim 1, wherein the raw material compound is selected from the group consisting of dipivaloyl-methanates, hexafluoro-acetyl-acetonates and penta-fluoro-propanoyl-pivaloyl-methanates of Pb and alkaline earth metals, and alkoxides of Ti and Zr.

8. A method for manufacturing an oxide-system dielectric thin film according to claim 2, wherein the raw material compound is selected from the group consisting of dipivaloyl-methanates, hexafluoro-acetyl--acetonates and penta-fluoro-propanoil-pivaloyl-methanoates of Pb and alkaline earth metals, and alkoxides of Ti and Zr.

9. A method for manufacturing an oxide-system dielectric thin film according to claim 1, wherein the raw material compound is dipivaloyl-methanate of Sr.

10. A method for manufacturing an oxide-system dielectric thin film according to claim 1, wherein the raw material compound is dipivaloyl-methanate of Ba.

11. A method for manufacturing an oxide-system dielectric thin film according to claim 1, wherein the raw material compound is dipivaloyl-methanate of Sr.

12. A method for manufacturing an oxide-system dielectric thin film according to claim 1, wherein the raw material compound is dipivaloyl-methanate of Ba.

13. A method for manufacturing an oxide-system dielectric thin film according to claim 1, wherein the organic solvent having a boiling point less than 100° C. is selected from the group consisting of hydrocarbons, alcohols, ethers, ketones and amines.

14. A method for manufacturing an oxide dielectric thin film according to claim 1, wherein the organic solvent having a boiling point less than 100° C. is selected the group consisting of diethylether, dimethyl-ketone and tetra-hydro-furan.

15. A method for manufacturing a dielectric thin film via chemical vapor deposition, comprising the steps of:
    selecting an organometallic compound;
    heating said compound in the presence of an inert carrier gas containing the vapor of an organic solvent having a boiling point less than 100° C. and a reactant gas for vaporizing and
    transporting said compound; and transporting a mixture of said compound, said reactant gas and said carrier gas into a reactor to deposit said dielectric film on a substrate in the reactor.

16. The method as recited in claim 15,
    wherein said organometallic compound is selected from the group consisting of Pb, Ti, Zr, Ta, and alkaline earth metal compounds.

17. The method as recited in claim 15,
    wherein said carrier gas is selected from the group consisting of argon, nitrogen, helium, and neon.

18. The method as recited in claim 15,
    wherein said organic solvent having a boiling point less than 100° C. is selected from the group consisting of hydrocarbons, alcohols, ethers, ketones, and amines.

19. The method as recited in claim 15,
    wherein said carrier gas contains a reactant gas selected from the group consisting of oxygen, $O_3$, and $N_2O$.

20. The method as recited in claim 15, wherein said substrate is a coated substrate.

21. The method as recited in claim 20, wherein said substrate is a coated with magnesium oxide.

22. In a method of forming an oxide-system dielectric thin film via chemical vapor deposition using an organometallic raw material compound, the improvement comprising:
    contacting said raw material compound in the presence of an inert gas with a vapor of an organic solvent having a boiling point less than 100° C. in one of a process for vaporizing or transporting said raw material compound.

23. The improved method as recited in claim 22, wherein said organometallic raw material compound includes a metal atom selected from the group consisting of Pb, Ti, Zr, Ta and alkaline earth metals.

24. The improved method as recited in claim 23, wherein said metal atom is Sr.

25. The improved method as recited in claim 23, wherein said metal atom is Ba.

26. The improved method as recited in claim 22, wherein said organometallic raw material compound is selected from the group consisting of acetyl-acetonates, dipivaloyl-methanates, alkoxides, hexafluoro-acetyl-acetonates, penta-fluoro-propanoyl-pivaloyl-methanates of metals, and derivatives of these.

27. The improved method as recited in claim 23, wherein said organometallic raw material compound is selected from the group consisting of acetyl-acetonates, dipivaloyl-methanates, alkoxides, hexafluoro-acetyl-acetonates, penta-fluoro-propanoyl-pivaloyl-methanates of metals, and derivatives of these.

28. The improved method as recited in claim 22, wherein said organometallic raw material compound is selected from the group consisting of dipivaloyl-methanates, hexafluoro-acetyl-acetonates and penta-fluoro-propanoyl-pivaloyl-methanates of Pb and alkaline earth metals, and alkoxides of Ti and Zr.

29. The improved method as recited in claim 23, wherein said organometallic raw material compound is selected from the group consisting of dipivaloyl-methanates, hexafluoro-acetyl-acetonates and penta-fluoro-propanoyl-pivaloyl-methanates of Pb and alkaline earth metals, and alkoxides of Ti and Zr.

30. The improved method as recited in claim 22, wherein said organometallic raw material compound comprises dipivaloyl-methanate of Sr.

31. The improved method as recited in claim 22, wherein said organometallic raw material compound comprises dipivaloyl-methanate of Ba.

32. The improved method as recited in claim 22, wherein said organic solvent having a boiling point less than 100° C. is selected from the group consisting of hydrocarbons, alcohols, ethers, ketones and amines.

33. The improved method as recited in claim 22, wherein said organic solvent having a boiling point less than 100° C. is selected from the group consisting of diethylether, dimethylketone and tetrahydrofuran.

* * * * *